(12) United States Patent
Priede et al.

(10) Patent No.: US 7,973,267 B2
(45) Date of Patent: Jul. 5, 2011

(54) APPARATUS AND METHOD FOR LEVITATION OF AN AMOUNT OF CONDUCTIVE MATERIAL

(75) Inventors: Janis Priede, Coventry (GB); Laurent Christophe Bernard Baptiste, Amsterdam (NL); Gerardus Gleijm, Ijmuiden (NL); Johannes Alphonsus Franciscus Maria Schade Van Westrum, Zevenaar (NL)

(73) Assignee: Tata Steel Nederland Technology BV, IJmuiden (NL)

( * ) Notice: Subject to any disclaimer, the term of this patent is extended or adjusted under 35 U.S.C. 154(b) by 921 days.

(21) Appl. No.: 11/573,704

(22) PCT Filed: May 31, 2005

(86) PCT No.: PCT/EP2005/005905
§ 371 (c)(1),
(2), (4) Date: Oct. 19, 2007

(87) PCT Pub. No.: WO2006/021245
PCT Pub. Date: Mar. 2, 2006

(65) Prior Publication Data
US 2008/0190908 A1  Aug. 14, 2008

Related U.S. Application Data

(63) Continuation-in-part of application No. 10/923,505, filed on Aug. 23, 2004, now Pat. No. 7,323,229.

(51) Int. Cl.
*C23C 14/26* (2006.01)
*C23C 14/54* (2006.01)
*H05B 6/32* (2006.01)
*H05B 6/44* (2006.01)

(52) U.S. Cl. ........ 219/648; 118/726; 427/591; 427/593; 427/598

(58) Field of Classification Search ........................ None
See application file for complete search history.

(56) References Cited

U.S. PATENT DOCUMENTS

| 2,664,496 | A | * | 12/1953 | Brace ............................ 219/648 |
| 2,686,864 | A | | 8/1954 | Wroughton et al. |
| 2,686,865 | A | * | 8/1954 | Kelly, Jr. ........................ 373/141 |
| 2,957,064 | A | | 10/1960 | Comenetz |

(Continued)

FOREIGN PATENT DOCUMENTS
JP  08104981 A  *  4/1996

(Continued)

OTHER PUBLICATIONS

US Published Patent Appln. No. 2005/0064110 A1, (U.S. Appl. No. 10/923,505), Schade Van Westrum et al., filed Aug. 23, 2004, published Mar. 24, 2005.

*Primary Examiner* — Joseph M Pelham
(74) *Attorney, Agent, or Firm* — Novak Druce + Quigg, LLP

(57) ABSTRACT

An apparatus for levitation of an amount of conductive material including a coil for keeping the material in levitation using a varying electric current in the coil. The apparatus has two coils, a first coil and a second coil, both coils generating an alternating electromagnetic field during use, the alternating electric field of the first and the second coil counteracting each other. The first and second coils are positioned such that the conductive material kept in levitation between the first coil and the second coil is evaporated. A method for generating an amount of levitated conductive material is also disclosed.

12 Claims, 2 Drawing Sheets

U.S. PATENT DOCUMENTS

Figure 1:
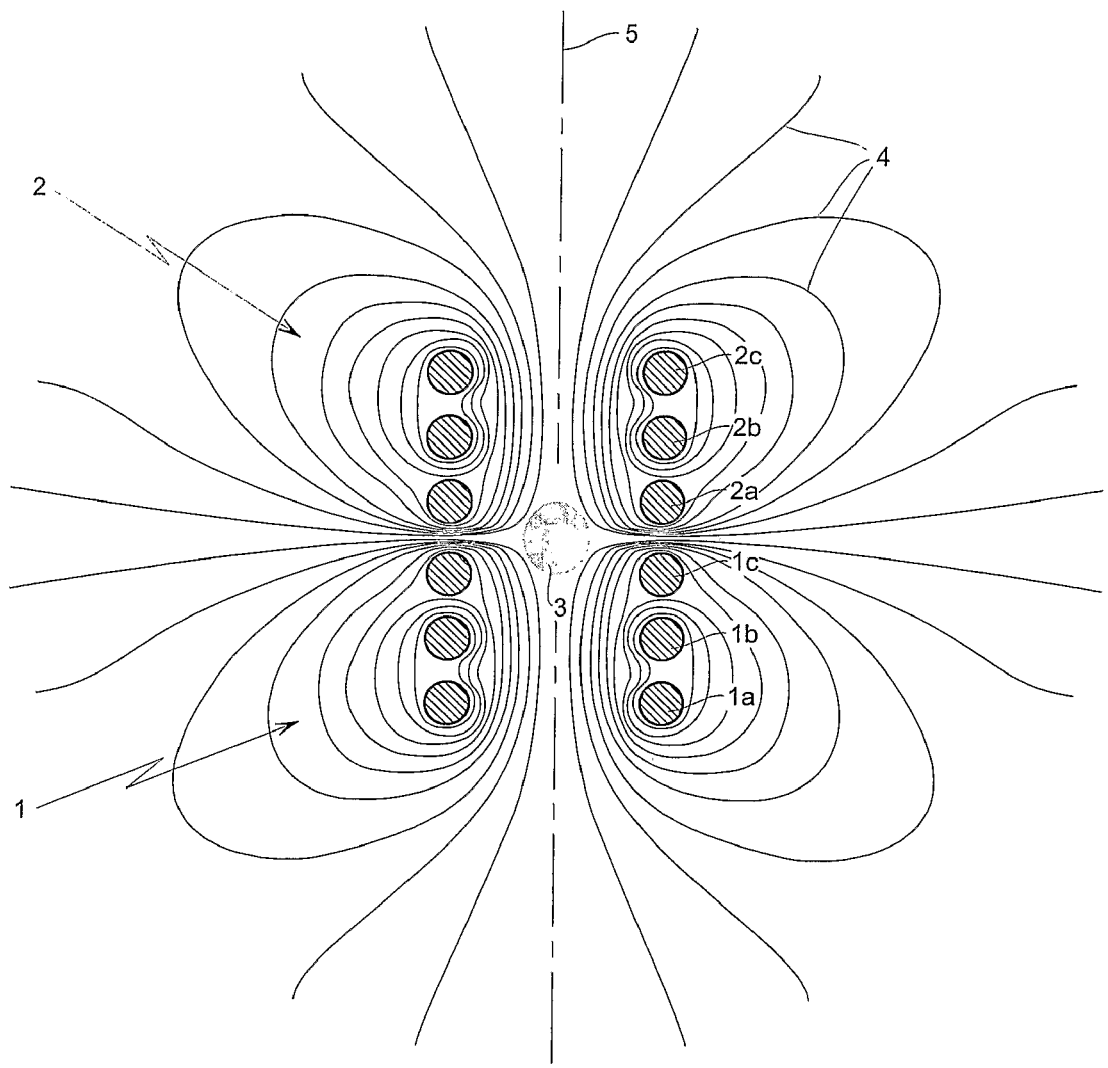

| | | | |
|---|---|---|---|
| 3,363,081 A | 1/1968 | Noiret | |
| 4,565,571 A * | 1/1986 | Abbaschian | 419/2 |
| 4,979,182 A | 12/1990 | Lohoefer | |
| 4,993,043 A | 2/1991 | Lohoefer | |
| 2005/0064110 A1 | 3/2005 | Schade Van Westrum et al. | |

FOREIGN PATENT DOCUMENTS

| | | | |
|---|---|---|---|
| JP | 11071605 A | * | 3/1999 |
| JP | 2003075078 A | * | 3/2003 |
| WO | 03071000 | | 8/2003 |

* cited by examiner

APPARATUS AND METHOD FOR LEVITATION OF AN AMOUNT OF CONDUCTIVE MATERIAL

This application is a §371 National Stage Application of International Application No. PCT/EP2005/005905, filed on 31 May 2005, which is a continuation-in-part of U.S. patent application Ser. No. 10/923,505 filed on 23 Aug. 2004 now U.S. Pat. No. 7,323,229.

The invention relates to an apparatus for levitation of an amount of conductive material, comprising a coil for keeping the material in levitation using a varying electric current in the coil. The invention also relates to a method for generating an amount of levitated conductive material using the apparatus.

The levitation of conductive material is known for physical vapour deposition, a technology for coating a substrate with a layer of material that is condensed from the vapour phase on the substrate in a vacuum chamber. Usually such material is kept in a crucible and heated in that crucible to melt and vaporize. However, a lot of energy is lost since the crucible has to be cooled. Often, the crucible is attacked by the material to be evaporated. For these reasons, electromagnetic levitation has been developed, as described in WO 03/071000 A1.

In electromagnetic levitation, an amount of conductive material is kept floating above a coil in which a varying electric current is fed. Due to the varying electric current, an alternating electromagnetic field is generated in the coil. The electromagnetic field exerts an upward directed force on the conductive material. This electromagnetic force balances the gravitational force acting on the conductive material, to keep the conductive material levitated. Since the magnetic force varies with the distance to the coil, the conductive material will be kept in levitation (or float) above the coil at a distance that depends on the current in the coil and the mass of the conductive material.

The electric current also provides electrical energy for heating the conductive material, such that it melts and eventually evaporates. The evaporated material is used to coat substrates, such as strip material.

The above apparatus has the drawback that the varying electric current both provides the levitation force and the heating power for the amount of conductive material. When it is necessary to heat the material to a higher temperature, for instance because the material has a higher melting and evaporation temperature or because a higher evaporation rate is required, the current should be increased. However, the levitation force of the electromagnetic field is than increased at the same time, resulting in the floating of the material above the coil at a greater distance to the coil. At this distance, the electromagnetic field is less, resulting in a heating power for the material that is lower than intended.

It is an object of the invention to provide an improved apparatus for levitation and heating of an amount of conductive material.

It is another object of the invention to provide an apparatus for levitation of an amount of conductive material with which apparatus the heating power for heating the material can be controlled.

It is a further object of the invention to provide a method for generating an amount of levitated conductive material with which the evaporation of the conductive material can be controlled.

One or more of these objects are reached with an apparatus for levitation of an amount of conductive material, comprising a coil for keeping the material in levitation using a varying electric current in the coil, wherein the apparatus comprises two coils, a first coil and a second coil, both coils generating an alternating electromagnetic field during use, the alternating electromagnetic field of the first and second coil counteracting each other, wherein the first and second coil are positioned such that the conductive material that is kept in levitation between the first coil and the second coil is evaporated.

Using two coils makes it possible to generate two electromagnetic fields, such that the conductive material will be kept in levitation in a stable position between the two coils. Due to the counteracting force of the alternating magnetic fields in the two coils, the conductive material cannot move away from the coils. Since now the conductive material is kept in place, it is possible to generate a higher current and so a higher temperature in the conductive material. This results in an evaporation rate of the conductive material that is high enough to coat a substrate with a velocity that is economically viable.

The conductive material will often melt due to the heating before it evaporates, but some materials will sublimate before they melt.

Preferably the coils have substantially the same center line. When the coils have the same center line, the conductive material is entrapped in between the two magnetic fields in the best possible way. When the center lines of the coils are displaced relatively, or enclose an angle, the conductive material is apt to leak out of the space between the coils when the conductive material is molten, and be lost for evaporation.

According to a preferred embodiment, the coils have windings that are all substantially closed loops. The magnetic fields generated by the coils will thus be substantially symmetrical around the center line of each coil. The conductive material is thus kept center in the space between the coils, and when the conductive material is molten, it will have a symmetrical shape corresponding to the symmetry in the magnetic field.

According to a first preferred embodiment, the coils each have a separate current supply. When the coils each have their own current supply, the magnitude of the current can be varied independent for each coil, and thus the levitation force and heating power can be varied, as can the distance between the coils. A drawback is that the alternating field of the coils must be well controlled.

According to a second preferred embodiment, the coils are connected and have the same current supply. In this way there is no problem with the phases of the magnetic fields, because the same current is used, but it is more difficult to form the coils because they are connected, and the distance cannot be changed after the coils are wound, and the heating power and levitation force cannot be varied independently of each other.

For this last preferred embodiment, preferably the coils are wound in opposite directions. Since the current flows in the same direction through the windings, in this way counteracting magnetic fields are generated in the coils.

According to a preferred embodiment, the first coil is situated substantially above the second coil. The gravity force acting on the levitated conductive material will then be substantially directed along the same line as the magnetic fields of the coils. The forces will thus be well-balanced.

Preferably, the first coil has the same number of windings or less winding than the second coil. In this way the magnetic field of the second (lower) coil is stronger than the magnetic field of the first (upper) coil, thus counteracting the gravity force and keeping the conductive material approximately halfway between the first and second coil.

According to a preferred embodiment, the first and second coils are mirror symmetric. With this configuration of the coils, the coils can be manipulated, as elucidated below.

According to a second aspect of the invention, provided is a method for generating an amount of levitated conductive material using an apparatus as discussed above, wherein the conductive material is entrapped in between the electromagnetic fields generated by the two coils so as to evaporate due to the heating by the current and frequency in the coils.

The entrapment of the conductive material between the two coils makes it possible to generate enough heating power in the conductive material when the current is increased, such that the conductive material evaporates at a rate that is high enough to be able to coat a substrate in an economically profitable way. In the known apparatus in which only one coil was used, for most materials the conductive material could not be heated to a temperature high enough to generate economic interesting evaporation rates for the coating of substrates.

Preferably, the evaporated conductive material is directed essentially along the direction of the center line of the coils for the coating of a substrate. Use is made of an isolating means, such as a duct or tube, between the coils and the conductive material; in this way the evaporated material can be directed to the substrate to be coated, without condensation on parts of the apparatus.

According to a preferred embodiment the coils are manipulated together so as to direct the evaporated conductive material with one or more degrees of freedom. This is possible now the conductive material is entrapped between the coils and cannot leave the combined magnetic fields of the coils. By manipulating the coils, for instance by rotation, the evaporated material can be directed in another direction, which makes it far more easy to coat one or more substrates that are present in the vacuum chamber.

Preferably, the coils are manipulated with six degrees of freedom. The coils can thus move in three directions and rotate around two horizontal axes and one vertical axe.

According to a preferred method, the strength of the electromagnetic fields in the two coils is such that the conductive material entrapped in the electromagnetic fields is forced towards the center line of the coils. This is especially useful when the evaporated material should be directed to a substrate that is not exactly above the coils. The coils can now be manipulated and the evaporated material directed in all directions, to coat substrates in the vacuum chamber.

The invention will be elucidated with reference to the accompanying drawing.

FIG. 1 shows in a schematic way the two coils according to the invention with the entrapped conductive material in cross-section.

Shown is a first coil 1 and a second coil 2, each coil consisting of three windings 1a, 1b, 1c and 2a, 2b, 2c. Coil 1 and coil 2 each produce an electromagnetic field, the field of coil 1 counteracting the field of coil 2 such that the resulting electromagnetic field entraps conductive material 3 that is provided between the coils. The electromagnetic fields are shown by the electromagnetic field lines 4.

As shown in the figure, due to the counteracting magnetic fields the strongest field is present between the two coils. This has the effect that the conductive material, here shown as a molten droplet, is forced towards the center line 5 of the symmetric coils. Moreover, it means that the droplet cannot move out of the coils, and thus that a high current can be generated in the windings of the coils, resulting in a high heating power of the coils. The droplet will thus be heated to a high temperature and evaporate fast. The evaporation rate of the (super)heated conductive material is high, and the coating velocity of a substrate economically attractive.

It will be understood that more than two coils can be used, and that the windings can be circular, but also can have another shape, preferably axially symmetrical. The windings could for instance be square. Instead of three windings for each coil, it is possible to use less or more windings, and the number of windings can differ for each coil. When the two coils are not connected, a different magnitude of the current in each coil can be used.

Figure 2:
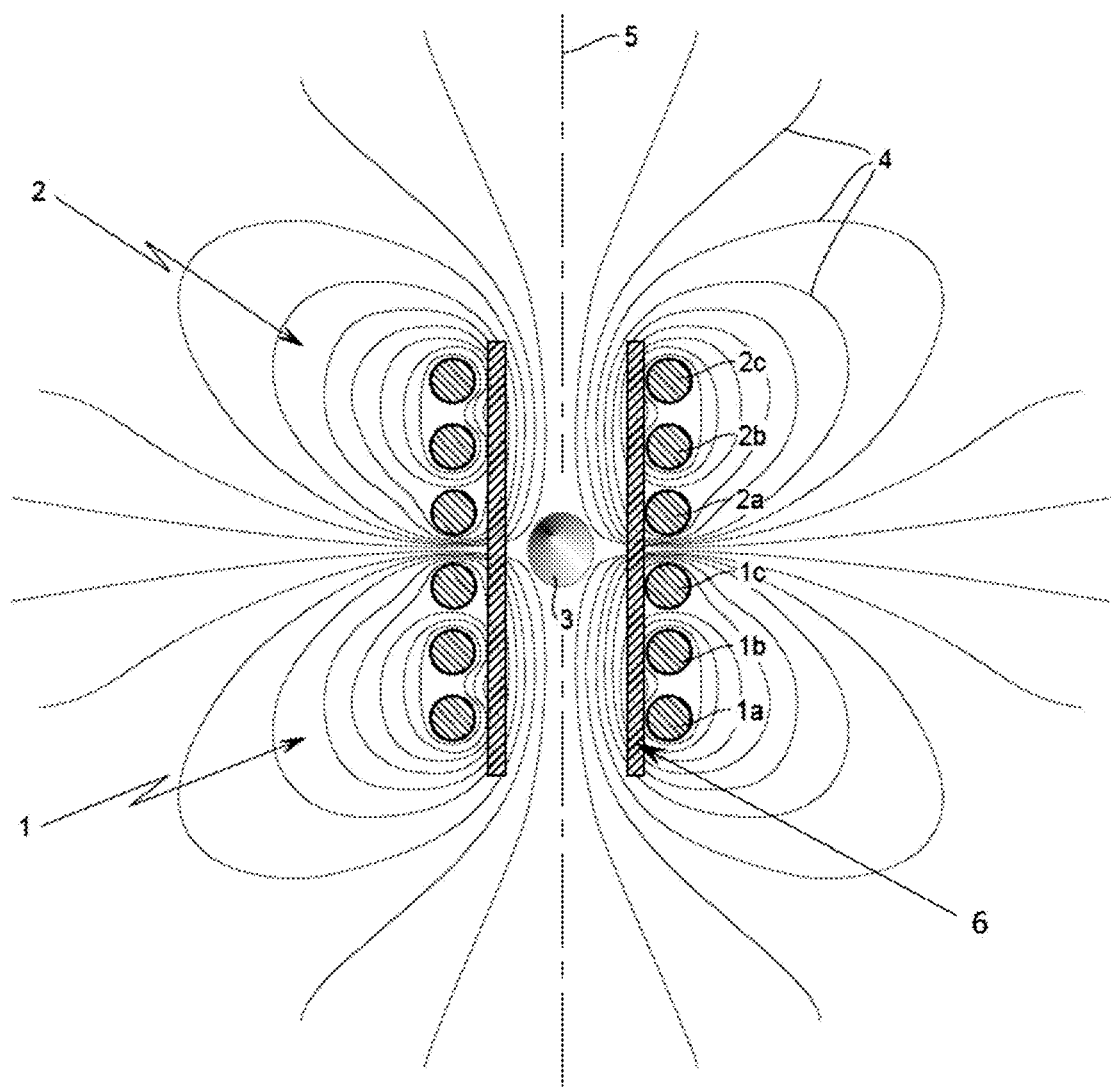

The evaporated material will mainly flow in the direction of the center line 5, in view of a duct or tube 6 of non-conductive material placed between the coils and the droplet as shown in FIG. 2. This duct prevents arcing between the windings and contamination of the vacuum chamber. The apparatus according to the invention makes it possible to manipulate the coils together, such that the direction of the center line is changed. In this way it is possible to coat a substrate not only from below or from above, but also sideways. It is also possible to displace the coils together in three directions. Due to the fact that the conductive material is entrapped between the two coils, the material will remain between the coils and evaporate before, during and after the manipulation.

It will be understood that for the physical vapour deposition according to this invention, the coils and the conductive material are kept in a vacuum of at least $10^{-3}$ mbar. The varying electric current and the frequency used have to be high enough to heat and evaporate the conductive material, which is used, and depends on the type of conductive material and the coating velocity required.

The invention claimed is:

1. Apparatus for levitation of an amount of conductive material, comprising a coil for keeping the material in levitation using a varying electric current in the coil,
   wherein the apparatus comprises two coils, a first coil and a second coil,
   wherein both coils have been placed in a vacuum chamber for a vacuum of at least 10.sup.-3 mbar during use, both coils for generating an alternating electromagnetic field during use, the alternating electromagnetic field of the first and the second coil counteracting each other,
   wherein the coils are rotatable and/or displaceable together so as to change the center line of the coils, and
   wherein a tube of non-conductive material is placed inside the coils such that the tube is present between the coils and the conductive material during use, and
   wherein the first and second coils are positioned such that the conductive material that is kept in levitation between the first coil and the second coil is evaporated and the evaporated material flows along the direction of the center line of the coils inside the tube of non-conductive material to a substrate to be coated.

2. Apparatus according to claim 1, wherein the coils have windings that are all substantially closed loops.

3. Apparatus according to claim 1, wherein the coils each have a separate current supply.

4. Apparatus according to claim 1, wherein the coils are connected and have the same current supply.

5. Apparatus according to claim 4, wherein the coils are wound in opposite directions.

6. Apparatus according to claim 1, wherein the first coil is situated substantially above the second coil.

7. Apparatus according to claim 6, wherein the first coil has the same number of windings or less windings than the second coil.

8. Apparatus according to claim 1, wherein the first and second coils are mirror symmetric.

9. Method for generating an amount of levitated conductive material using an apparatus according to claim 1 wherein the conductive material is entrapped in between the electromagnetic fields generated by the two coils so as to evaporate due to the heating by the current and frequency in the coils, wherein the evaporated conductive material is directed essentially along the direction of the center line of the coils for the coating of a substrate.

10. Method according to claim 9, wherein the coils are manipulated together so as to direct the evaporated conductive material with one or more degrees of freedom.

11. Method according to claim 10, wherein the coils are manipulated with six degrees of freedom.

12. Method according to claim 9, wherein the strength of the electromagnetic field in the two coils is such that the conductive material entrapped in between the electromagnetic fields is forced towards the center line of the coils.

* * * * *

UNITED STATES PATENT AND TRADEMARK OFFICE
CERTIFICATE OF CORRECTION

PATENT NO. : 7,973,267 B2
APPLICATION NO. : 11/573704
DATED : July 5, 2011
INVENTOR(S) : Janice Priede et al.

Page 1 of 1

It is certified that error appears in the above-identified patent and that said Letters Patent is hereby corrected as shown below:

Column 4, line 30, cancel the text beginning with "1. Apparatus for levitation" to and ending "material to a substrate to be coated." at column 4, line 50, and insert the following claim:

--1.   Apparatus for levitation of an amount of conductive material, comprising a coil for keeping the material in levitation using a varying electric current in the coil, wherein the apparatus comprises two coils, a first coil and a second coil, wherein both coils have been placed in a vacuum chamber for a vacuum of at least $10^{-3}$ mbar during use, both coils for generating an alternating electromagnetic field during use, the alternating electromagnetic field of the first and the second coil counteracting each other, wherein the coils are rotatable and/or displaceable together so as to change the center line of the coils, and wherein a tube of non-conductive material is placed inside the coils such that the tube is present between the coils and the conductive material during use, and wherein the first and second coils are positioned such that the conductive material that is kept in levitation between the first coil and the second coil is evaporated and the evaporated material flows along the direction of the center line of the coils inside the tube of non-conductive material to a substrate to be coated.--

Signed and Sealed this
Third Day of April, 2012

David J. Kappos
*Director of the United States Patent and Trademark Office*